United States Patent
Keefe et al.

(10) Patent No.: US 11,848,349 B1
(45) Date of Patent: Dec. 19, 2023

(54) CURVED SEMICONDUCTOR AND METHOD OF FORMING THE SAME

(71) Applicant: HRL LABORATORIES, LLC, Malibu, CA (US)

(72) Inventors: Andrew C. Keefe, Encino, CA (US); Geoffrey P. McKnight, Los Angeles, CA (US); Alexander R. Gurga, Canoga Park, CA (US); Ryan Freeman, Los Angeles, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 16/389,238

(22) Filed: Apr. 19, 2019

Related U.S. Application Data

(60) Provisional application No. 62/688,143, filed on Jun. 21, 2018.

(51) Int. Cl.
*H01L 27/146* (2006.01)
*H01L 27/148* (2006.01)

(52) U.S. Cl.
CPC .. *H01L 27/14683* (2013.01); *H01L 27/14607* (2013.01); *H01L 27/14806* (2013.01)

(58) Field of Classification Search
CPC ..... H01L 27/14665–14676; H01L 21/823406; H01L 27/1057; H01L 29/765–76891; H01L 29/66946–66962; H01L 27/14689; H01L 23/13; H01L 23/14; H01L 23/142; H01L 23/145; H01L 23/147; H01L 23/15; H01L 27/14643; H01L 27/146; H01L 27/14601; H01L 27/14603; H01L 27/14605; H01L 27/14607

See application file for complete search history.

(56) References Cited

U.S. PATENT DOCUMENTS

| | | | |
|---|---|---|---|
| 7,507,944 B1* | 3/2009 | Arnzen | H01L 27/1464 250/239 |
| 9,349,763 B1* | 5/2016 | Lin | H01L 27/14634 |
| 9,570,488 B2 | 2/2017 | McKnight et al. | |
| 9,870,927 B2 | 1/2018 | Keefe et al. | |
| 2016/0086987 A1* | 3/2016 | McKnight | H01L 27/14687 257/432 |
| 2016/0086994 A1* | 3/2016 | Guenter | H01L 27/14607 257/466 |
| 2016/0293429 A1* | 10/2016 | Keefe | H01L 23/13 |

OTHER PUBLICATIONS

Guenter, Brian et al., "Highly curved image sensors: a practical approach for improved optical performance", *Optics Express* 13010, vol. 25, No. 12, Jun. 12, 2017, located at https://doi.org/10.1364/OE.25.013010, 14 pps.

* cited by examiner

*Primary Examiner* — Julio J Maldonado
*Assistant Examiner* — Stanetta D Isaac
(74) *Attorney, Agent, or Firm* — Lewis Roca Rothgerber Christie LLP

(57) ABSTRACT

A method of forming a curved semiconductor includes: forming a device layer on a semiconductor substrate; forming a metal layer on the device layer; removing the semiconductor substrate from the device layer; and curving the device layer and the metal layer.

12 Claims, 3 Drawing Sheets

CURVED SEMICONDUCTOR AND METHOD OF FORMING THE SAME

CROSS-REFERENCE TO RELATED APPLICATION

The present application claims priority to and the benefit of U.S. Provisional Patent Application Ser. No. 62/688,143, filed on Jun. 21, 2018, the entire content of which is incorporated herein by reference.

STATEMENT REGARDING FEDERALLY SPONSORED RESEARCH OR DEVELOPMENT

This invention was made with U.S. Government support under Contract No. 2017-17033000004, awarded by the Intelligence Advanced Research Projects Activity (IARPA). The U.S. Government has certain rights to this invention.

BACKGROUND

1. Field

Aspects of embodiments of the present disclosure relate to a curved semiconductor and a method of forming a curved semiconductor.

2. Description of Related Art

One application of curved semiconductors (e.g., curved semiconductor devices or curved sensors) is for optical sensors, such as complementary metal-oxide-semiconductor (CMOS) and charge-coupled device (CCD) sensors for imaging systems (e.g., cameras) and/or light detection and ranging (LIDAR) systems. Compared to related art flat sensor imaging devices, curved sensor imaging systems allow a wider range of optical lens designs and, subsequently, may be able to acquire sharper, more detailed images and operate with lower light levels, thereby extending the operational window (e.g., the operational parameters) for the imaging device when compared to related art flat sensor imaging devices. Curved sensor imaging systems, due at least in part to the potential to increase the numerical aperture of the lens and, thus, gather more illumination intensity on the sensor, may also be capable of acquiring images at a higher frame rate and with less noise than related art flat sensor imaging devices. Curved sensor imaging devices may be used in, as a few examples, surveillance systems, such as high-powered cameras and/or satellite-based imaging systems, and autonomous devices, such as autonomous vehicles and/or drones. Depending on the needs and design of a particular optical system, including any lenses, the desired curvature of the curved sensor imaging device may by spherical, aspherical, cylindrical, parabolic, or any suitable non-planar surface or shape.

Generally, curved semiconductors (e.g., curved sensors) that are formed by the bending of semiconductors that are initially flat tend to creep back toward their initial flat state due to elastic strain energy stored in the semiconductor material. This creep back to the flat state negatively affects the output quality of the sensor due to, for example, misalignment issues between the as-designed curved lens image field and the relaxed sensor surface profile. To maintain accurate sensor output over the lifetime of the sensor, it is desirable that the curved shape of the semiconductor be maintained as accurately as possible.

Related art methods of curving semiconductors have been enabled by first thinning the semiconductor substrate from the as-fabricated wafer thickness of about 300 to about 500 microns to a final thickness of about 10 to about 100 microns. After curving the thinned substrate, because semiconductor materials are generally not plastically deformable and, therefore, tend to return to their flat shape, the curved thinned substrate is adhered to a curved package by an adhesive, such as glue or solder, to maintain its curved shape. The package may be a ceramic leadless chip carrier (CLCC) curved to match the curvature of the curved semiconductor (e.g., the CLCC may have a curved surface with the same or substantially the same radius of curvature as the curved semiconductor). The thickness of the die carrier, according to the related art methods, is determined according to an aspect ratio of the length of the sensor die to the thickness thereof. According to the related art methods, the aspect ratio is desirably in a range from about 20 to about 50 depending on the final desired curvature of the sensor die. This aspect ratio improves the chances that the die carrier will remain mechanically stable throughout the bending process, where a combination of compression, shear, and tension may lead to mechanical instability and die carrier failure. Thus, as the die carrier length increases, the thickness thereof should be proportionally increased to maintain the desired aspect ratio. However, to maintain this aspect ratio with a relatively large die carrier, for example, a die carrier having a length of about 4 cm to about 10 cm, the thickness of the die carrier eventually approaches the wafer thickness, thereby creating an undesirably thick semiconductor device.

Because common semiconductor materials, such as silicon, are non-yielding, they tend to store strain energy when bent or curved, causing them to straighten back towards their initial flat state after being bent or curved. Hence, the curved semiconductors according to the related art methods are adhered to the curved package so that the curved semiconductor may maintain its curved shape. Generally, the thicker the semiconductor (or silicon) layer, the more strain energy is stored during the bending or curving process. As such, the thicker the semiconductor (or silicon) layer, the greater the force that is exerted by the semiconductor layer to return it to its flat state after being bent or curved. Due to the semiconductor layer's tendency to return to its initial flat state, the adhesive used to adhere the curved semiconductor to the package may be excessively stressed, causing peeling and return of the semiconductor to a flatter state, thereby negatively affecting the output of the curved semiconductor device or sensor. Thus, a thinner die can achieve a greater curvature than a larger die. Due to is lower stored strain energy, the smaller die is better able to maintain its curved state and is more reliable.

SUMMARY

Aspects of embodiments of the present disclosure are directed toward a curved semiconductor and a method of forming the same. The curved semiconductor (e.g., the spherically curved semiconductor) may be an imaging sensor. The curved semiconductor may include a device layer and a metal layer acting as a substrate for the device layer. In forming the curved semiconductor, a semiconductor substrate (e.g., a semiconductor carrier) may be removed from the device layer, and the metal layer may be deposited on the device layer to act as the substrate in place of the removed semiconductor substrate. By substantially replacing the non-yielding semiconductor substrate with yielding (that is, having a low yield strength) metal layer, the device layer, which includes the non-yielding semiconductor material, may be prevented or substantially prevented from creeping back to its initial flat state due to the plastically deformed metal layer, which, due at least in part to its larger thickness, is sufficiently stiff to overcome any strain energy stored in the non-yielding semiconductor material. In addition, by introducing the metal layer on a larger die, the flaw-dependent scaling issue that may otherwise limit the formability (and bendability) of semiconductor dies with larger (or longer) edges may be reduced or eliminated, thereby increasing the sizes of sensors which may be reliably formed into curved states.

According to an embodiment of the present disclosure, a method of forming a curved semiconductor including: forming a device layer on a semiconductor substrate; forming a metal layer on the device layer; removing the semiconductor substrate from the device layer; and curving the device layer and the metal layer.

The metal layer may include copper.

The removing of the semiconductor substrate may include removing the semiconductor substrate by lapping and/or etching.

The device layer and the semiconductor substrate may both include a same semiconductor material, and a thickness of the semiconductor material before the removing of the semiconductor substrate may be in a range of about 300 microns to about 800 microns.

The thickness of the semiconductor material after the removing of the semiconductor substrate may be in a range of about 2 microns to about 20 microns.

The semiconductor substrate may include silicon.

The combined device layer and metal layer may have a length-to-thickness ratio of about 20 to about 50.

A thickness of the metal layer may be about 50 microns or greater.

The method may further include forming a seed layer on the device layer, and the forming of the metal layer may include forming the metal layer on the seed layer.

According to an embodiment of the present disclosure, a method of forming a curved semiconductor includes: mounting a first surface of a device layer onto a handle, a semiconductor substrate being on a second surface of the device layer;
  removing the semiconductor substrate from the second surface of the device layer to expose the second surface of the device layer; forming a metal layer on the exposed second surface of the device layer; and curving the device layer and the metal layer.

The method may further include forming the device layer on the semiconductor substrate before the mounting of the device layer on the handle.

The removing of the semiconductor substrate may include lapping and/or etching.

The metal layer may include copper.

The device layer may have a thickness in a range from about 2 microns to about 20 microns, and the metal layer may have a thickness of about 50 microns or greater.

According to an embodiment of the present disclosure, a curved semiconductor includes a curved semiconductor device layer and a curved metal layer on the semiconductor device layer. The combined device layer and metal layer has a length-to-thickness ratio of about 20 to about 50.

The semiconductor device layer may have a side edge length of greater than or equal to about 3 cm.

An overall thickness of a semiconductor material in the curved semiconductor may be in a range of about 2 microns to about 20 microns.

The metal layer may have a thickness of about 50 microns or greater.

The semiconductor device layer may include an imaging sensor.

BRIEF DESCRIPTION OF THE DRAWINGS

These and other aspects and features of the present disclosure will be further appreciated and better understood with reference to the specification, claims, and appended drawings, in which:

DETAILED DESCRIPTION

The detailed description set forth below in connection with the appended drawings is intended as a description of example embodiments of the present disclosure and is not intended to represent the only forms in which the present disclosure may be embodied. The description sets forth aspects and features of the present disclosure in connection with the illustrated embodiments. It is to be understood, however, that the same or equivalent aspects and features may be accomplished by different embodiments, and such other embodiments are encompassed within the spirit and scope of the present disclosure. As noted elsewhere herein, like element numbers in the description and the drawings are intended to indicate like elements. Further, descriptions of features, configurations, and/or other aspects within each embodiment should typically be considered as available for other similar features, configurations, and/or aspects in other embodiments.

Figure 1A:
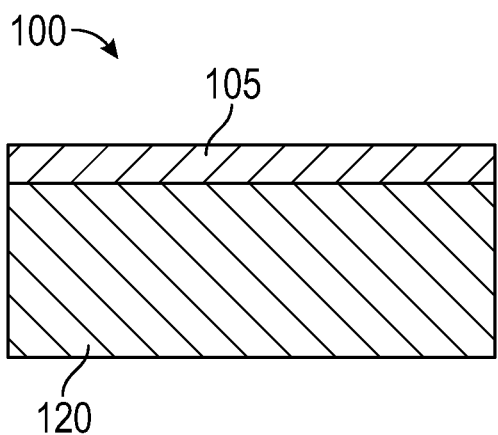
FIGS. 1A and 1B are schematic illustrations of a semiconductor in an initial flat state and in a curved state, respectively.
Figure 1B:
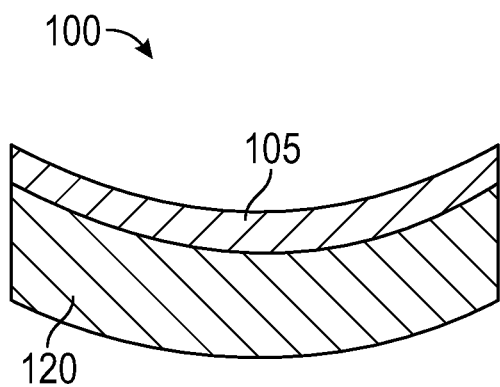

FIG. 1A is a schematic illustration of a semiconductor device 100 in an initial flat state according to an embodiment of the present disclosure, and FIG. 1B is a schematic illustration of the semiconductor device shown in FIG. 1A in a curved state. FIGS. 1A and 1B are schematic drawings in that they are two-dimensional cross-sectional slices of the semiconductor device. As will be further described below, "curved" or as used herein refers to being curved in two dimensions to have three-dimensional curvature. For example, the curved semiconductor device shown in FIG. 1B may have a three-dimensional concave curvature, similar to a shallow bowl shape. Alternatively, it may have a three-dimensional convex curvature, similar to an inverted shallow bowl shape. It may have a spherical surface or a parabolic surface or any non-planar surface.

In FIGS. 1A and 1B, the semiconductor device 100 includes a device layer (for example, a device or plurality of devices fabricated from a semiconductor substrate) 105 and a metal layer 120. The device layer 105 may be an imaging device, such a complementary metal-oxide-semiconductor (CMOS) or charge-coupled device (CCD) array configured to sense visible light, infrared light, ultraviolet light, etc. The imaging device may be used in various suitable applications, such as in visible light cameras (e.g., personal cameras, satellite cameras, etc.), infrared cameras, LIDAR devices, etc. The examples of the device layer 105 provided herein are merely examples, and the present disclosure is not limited thereto. The device layer 105 may comprise any suitable semiconductor device. The device layer 105 may be fabricated on a silicon (Si) substrate, such as a single-crystal silicon (Si), but the present disclosure is not limited thereto. As another example, the device layer 105 may be fabricated on a germanium (Ge) substrate, one or more of the III-V family of semiconductors, such as indium gallium arsenide (InGaAs), indium arsenide antimonide (InAsAb), indium antimonide (InSb), and alloys thereof, and/or one or more of the II-VI family of compounds, such as mercury cadmium telluride (HgCdTe) alloys.

When bending a semiconductor structure, such as the device layer 105 and a substrate layer (e.g., a carrier layer) on which the device layer 105 is formed (not shown in FIG. 1), relatively large stresses develop in the semiconductor. Also, when a semiconductor, such as a silicon-on-insulator (SOI) carrier or germanium-on-insulator (GOI) substrate, is formed or manufactured, flaws are introduced in the substrate layer as well as the device layer(s). These defects may be fabrication defects (e.g., bulk defects) or may be defects formed during the manufacturing process, such as surface flaws formed during the slicing and polishing steps or edge flaws formed during the cutting of individual dies. It has been found that the fracture strength of a semiconductor is inversely proportional to the square root of the flaw size. Recent advances in semiconductor manufacturing technology have reduced the size of, but not eliminated, flaws. Generally, for bulk defects, the smaller the semiconductor device, the smaller any flaws are in the semiconductor device. Thus, as described above, related art methods and processes of curving semiconductors have been limited in the size of the semiconductor which can reliably be bent (e.g., limited to less than about 2 cm on a side) due to the reliance on the mechanical stability provided by a relatively narrow range of die edge length to thickness aspect ratios, from about 20 to about 50, during the bending process, as discussed above. According to the related art methods, when bending relatively large dies, the thicknesses thereof must be increased accordingly to maintain mechanical stability by maintaining the desired aspect ratio. But the larger thickness increases both the total number of defects as well as the maximum size of defects. Also relevant to a semiconductor's strength is intrinsic fracture toughness, which indicates the material's resistance to flaw propagation. Unlike semiconductor strength, which is dependent on flaw size, intrinsic fracture toughness is a fixed property of the material, and silicon (Si) has a relatively low fracture toughness.

Figure 2:
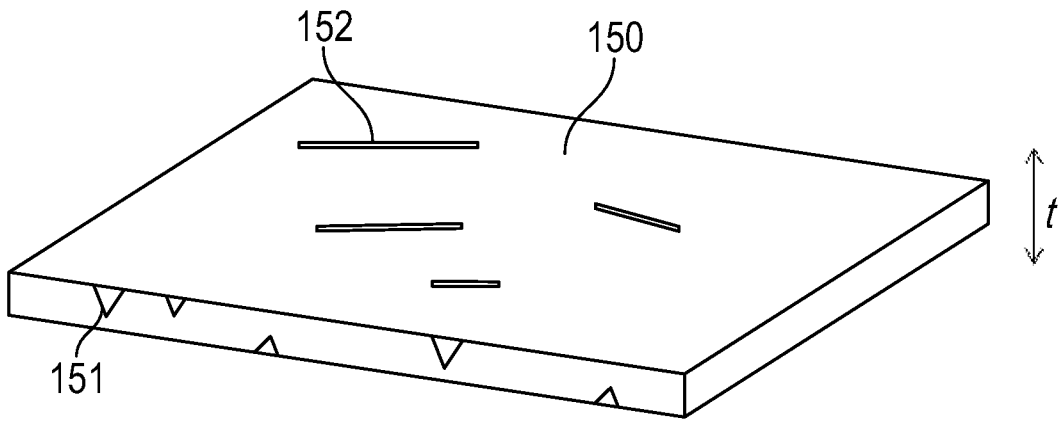
FIG. 2 is a schematic illustration of a semiconductor substrate showing examples of surface and edge defects.

FIG. 2 is a schematic illustration of a semiconductor substrate 150 having thickness t and including edge defects 151 and surface defects 152. A semiconductor device layer 105 (not shown in FIG. 2) may be formed on a surface of the semiconductor substrate 150. Not shown in FIG. 2 are bulk defects contained within the volume of the semiconductor substrate.

When curving or bending a semiconductor according to related art methods, the final or target die curvature has been limited by the flaw size in the semiconductor given the fixed fracture toughness. In related art methods, the size of the semiconductor was limited (e.g., limited to less than about 2 cm on a side) to increase the maximum die curvature, meaning that related art methods of curving (e.g., spherically curving) a semiconductor were generally limited to curving semiconductor substrates of less than about 2 cm on a side.

According to embodiments of the present disclosure, the lateral dimensions of the semiconductor device to be curved may be substantially greater than 2 cm on a side by, for example, reducing the overall thickness of the semiconductor material in the device and by adding a metal layer. A semiconductor wafer may generally have a thickness (e.g., thickness t of the semiconductor substrate 150 in FIG. 2) in a range of about 300 to about 800 microns. According to embodiments of the present disclosure, the overall thickness of the semiconductor material in the semiconductor is reduced to the device layer (e.g., the device layer 105 in FIG. 1) itself or to the device layer and a small layer (e.g., a small fraction) of the original semiconductor substrate (e.g., the semiconductor carrier), and the overall thickness of the semiconductor material may be in a range of about 2 microns to about 20 microns, as will be further described below. To reduce instances of buckling or wrinkling the relatively thin semiconductor material (e.g., the device layer 105 in FIGS. 1A and 1B) during curving or bending, a relatively thick metal layer (e.g., the metal layer 120 in FIGS. 1A and 1B) may be formed on (e.g., applied to or deposited on) the relatively thin semiconductor material. The relatively thick metal layer also yields (e.g., plastically deforms) during the curving or bending process, thereby enabling the semiconductor material to be reliably held (or maintained) in the final, curved shape.

Figure 4:
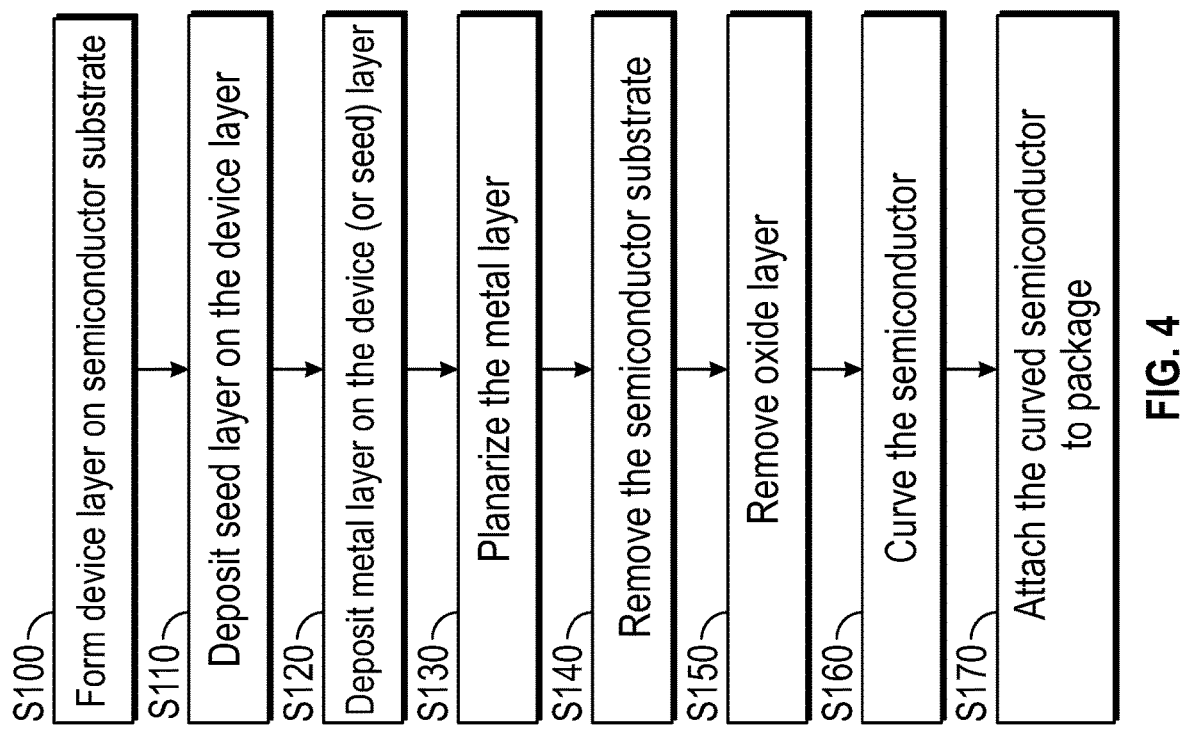
FIG. 4 is a flowchart illustrating the method of forming the curved semiconductor shown in FIG. 3.
Figure 3:
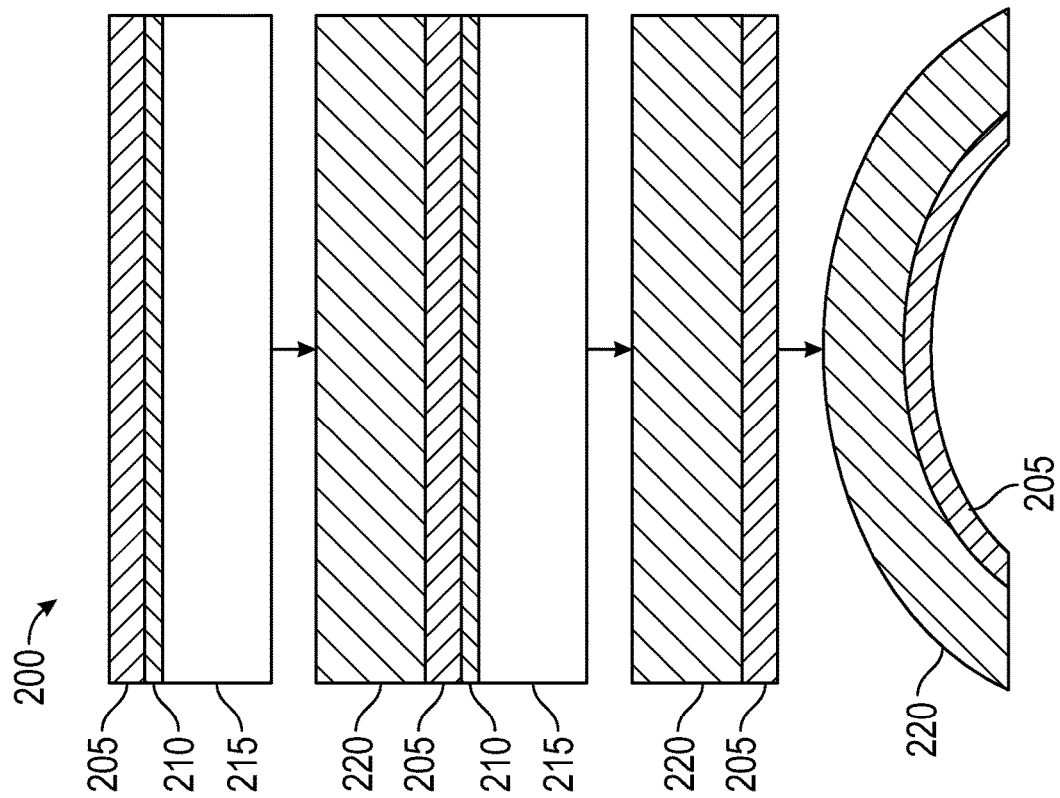
FIG. 3 is a schematic diagram of a method of forming a curved semiconductor according to an embodiment of the present disclosure.

FIG. 3 is a schematic diagram illustrating a method of curving or bending a semiconductor 200 according to an embodiment of the present disclosure, and FIG. 4 is a flowchart illustrating the method of curving or bending the semiconductor 200 shown in FIG. 3. Referring to FIGS. 3 and 4, a device layer 205 is formed on a semiconductor substrate (e.g., a semiconductor die or semiconductor carrier) 215 (S100). The semiconductor substrate 215 may be a silicon-on-insulator (SOI) substrate or a germanium-on-insulator (GOI) substrate, and in such embodiments, the device layer 205 may be formed on an oxide layer 210 of the semiconductor substrate 215. The present disclosure is not limited thereto, however, and any suitable semiconductor may be used for the semiconductor substrate 215. The oxide layer 210 may be (or may include) an oxide of the semiconductor of the semiconductor substrate 215, for example, silicon dioxide ($SiO_2$) when the semiconductor substrate 215 is the silicon-on-insulator (SOI) substrate, but the present disclosure is not limited thereto. In some embodiments, the oxide layer 210 may be omitted. The oxide layer 210 may facilitate the removal of the semiconductor substrate 215 by acting as an etch stop during chemical removal (e.g., chemical etching) processes, thus permitting the semiconductor substrate 215 to be accurately removed to provide a substantially uniform thickness across the remaining material, which comprises the device layer.

When the semiconductor substrate 215 is made of (or includes) silicon (Si), the device layer 205 may include (or may be formed of) silicon (Si) with metal traces formed therein. When the semiconductor substrate 215 is made of (or includes) a semiconductor material other than silicon (Si), the device layer 205 may include that semiconductor material along with metal traces formed therein. In some embodiments, the metal traces may be (or may include) copper (Cu), but the present disclosure is not limited thereto.

In some embodiments, the device layer 205 may be (or may include) an imaging device or plurality of imaging devices, such as those described above with reference to the device layer 105 shown in FIGS. 1A and 1B. The device layer 205 may be formed by any suitable method depending on the type of device to be formed. For example, in an embodiment in which the device layer 205 is a CMOS sensor, a CMOS process including photolithography may be used to form the CMOS sensor.

In some embodiments, a seed layer (not shown) may be formed on (e.g., deposited on) the device layer 205 (e.g., the seed layer may be formed on a surface of the device layer 205 opposite to the surface contacting the semiconductor substrate 215 and/or the oxide layer 210) (S110). The seed layer may be deposited on the device layer 205 by, for example, physical vapor deposition (PVD), such as sputtering, or chemical vapor deposition (CVD). In some embodiments, the seed layer may be omitted. For example, the seed layer may be omitted depending on the material of the to-be-formed metal layer 220, described below, and/or depending on the process for forming the metal layer 220. The seed layer may increase adhesion between the device layer 205, which includes a semiconductor material, such as silicon (Si), and the to-be-formed metal layer 220, which may be formed of copper (Cu). The seed layer may enable electroplating of the metal layer 220 by serving as an electrode in an electrochemical plating bath. The seed layer may be (or may include) tantalum (Ta), titanium (Ti), and/or gold (Au). The present disclosure, however, is not limited thereto, and any suitable material may be used for the seed layer based on the materials of the semiconductor substrate 215 and the metal layer 220.

Next, the metal layer 220 is formed on (e.g., deposited on) the seed layer or on the device layer 205 when the seed layer is omitted (S120). The metal layer 220 may be deposited by an electrodeposition process, such as electroplating. The metal layer 220 may be formed of (or may include or may be an alloy of) copper (Cu). However, the present disclosure is not limited to copper, and any suitable metal may be used to form the metal layer 220.

The metal layer 220 may be deposited to be relatively thick compared to the device layer 205. In some embodiments, the metal layer 220 may be deposited such that the combined device layer 205, oxide layer 210, semiconductor substrate 215, and metal layer 220 have a length-to-thickness ratio of about 20 to about 50 (e.g., such that the combined device layer 205, oxide layer 210, semiconductor substrate 215, and metal layer 220 are about 20 to about 50 times longer along a side edge than they are thick). In some embodiments, the metal layer 220 may have a thickness of equal to or greater than about 100 microns.

As one example embodiment, when the semiconductor substrate 215 is a 3 cm by 3 cm die and the device layer 205 is about 10 microns thick, the metal layer 220 may be formed to have a thickness in a range of about 50 microns to about 140 microns or greater.

The metal layer 220 may be planarized (S130). In some embodiments, however, the metal layer 220 may not be planarized. By planarizing the metal layer 220, the thickness of the deposited metal layer 220 may be more accurately controlled, and the metal layer 220 may have a more uniform thickness across the semiconductor substrate 215. To facilitate the planarization of the metal layer 220, the semiconductor substrate 215 may be mounted to a fixture (e.g., a handle) to securely hold the semiconductor 200 to provide more accurate planarization of the metal layer 220.

The semiconductor substrate 215 is removed from the semiconductor 200 (S140). To remove the semiconductor substrate 215 from the device layer 205, the semiconductor device 200 may be placed into a fixture (e.g., a handle), or may remain in the fixture if it was previously placed in a fixture, with the semiconductor substrate 215 exposed. Then, the semiconductor substrate 215 may be removed by lapping and/or etching. However, the present disclosure is not limited thereto, and in some embodiments, the semiconductor substrate 215 may be removed only by lapping or removed only by etching. The etching may be dry or wet etching (e.g., selective reaction ion etching) using an etch (e.g., a highly selective etch) that has a relatively high etch rate with the material of the semiconductor substrate 215 (e.g., silicon) and a relatively very low etch rate with the material of the oxide layer 210 (e.g., silicon dioxide ($SiO_2$)). As one example, deep reactive ion etching using sulfur hexafluoride ($SF_6$) may be used.

After the semiconductor substrate 215 is removed (e.g., is etched), the oxide layer 210 may be removed as well (S150). In some embodiments, however, the oxide layer 210 may not be removed, leaving the oxide layer 210 on the device layer 205. Even in embodiments in which the oxide layer 210 is removed, some of the oxide layer 210 may remain to protect the device layer 205. The remaining oxide may be between a few tenths of a nanometer to a few microns in thickness. The oxide layer 210 may be removed by, for example, any suitable dry or wet etching process by using an etchant (e.g., a highly selective etchant) that has a relatively high etch rate with the oxide layer 210 (e.g., with silicon dioxide ($SiO_2$)) and has a relatively very low etch rate with the base material of the device layer 205 (e.g., with silicon). As one example, hydrofluoric acid-based wet or vapor etching may be used.

The semiconductor device 200 may also be cut or trimmed. For example, excess lateral semiconductor material may be cut from the semiconductor device 200 so that the semiconductor device 200 may fit into a desired package, to be further described below.

Then, the semiconductor device 200 (e.g., the device layer 205 with the metal layer 220 formed thereon) is curved, bent, or otherwise shaped (S160). The semiconductor device 200 may be curved by using any suitable process. As one example, pneumatic curving may be used. In pneumatic curving, the semiconductor device 200 may be arranged in or over a die or mold having a desired, three-dimensional curvature, and a membrane may be arranged over the semiconductor device 200 such that the semiconductor device 200 is between the die or mold and the membrane. Then, pressure is applied to the exposed surface of the membrane and/or vacuum is introduced below the membrane, thereby pushing and/or pulling the membrane into contact with the semiconductor device 200 to curve the semiconductor device 200 along the die or mold. One example of pneumatic curving is called free-edge semiconductor bending, as described in U.S. Pat. No. 9,870,927. Another example is bending induced by substrate swelling, as described in U.S. Pat. No. 9,570,488. The semiconductor device 200 may be curved such that the exposed surface of the device layer 205 has a concave shape. However, the present disclosure is not limited thereto, and the semiconductor device 200 may be curved such that the exposed surface of the device layer 205 has a convex shape.

After curving the semiconductor device 200, the curved semiconductor device 200 may be attached to a package (S170). The package may be a ceramic leadless chip carrier (CLCC) curved to match the curvature of the curved semiconductor device 200 (e.g., the CLCC may have a curved surface with the same or substantially the same radius or radii of curvature as the curved semiconductor device 200). In some embodiments, the package may be include a curved molding surface, formed of a metal, glass, and/or semiconductor, that is then mated to a flat ceramic package for connection to the readout electronics. In such an embodiment, the package includes two components that are bonded together with the curved sensor to form the overall packaged sensor. The package may provide structural rigidity as well as make the curved semiconductor device 200 suitable for installation in an electronic device or the like. The curved semiconductor device 200 may be attached to the package by using glue, solder, or by mechanical fastening. Different from the related art curved semiconductors, embodiments of the present invention reduce the required adhesive strength for attaching the curved sensor to the package. Because of the plastic flow of the metal layer 220 and the reduced thickness of (or entire removal of) the semiconductor substrate 215, the overall stored strain energy is significantly reduced because the only stored mechanical energy (e.g., strain energy) is that associated with the device layer 205 and what remains, if anything, of the semiconductor substrate 215. In some embodiments, the stored strain energy may be reduce by $10x$ when compared to related art methods with a roughly proportional reduction in the bond layer stress in the curved state. In some embodiments, such as for relatively large semiconductor devices (for example, ones measuring 1 cm, or more, on a side), this reduction in stored energy significantly increases the maximize degree of curvature achievable. In embodiments using relatively small semiconductor devices, this reduction in stored energy allows for a wider range of fastening options for adhesive and solders between the curved sensor and the package.

Because the material of the semiconductor substrate 215 and the device layer 205 (e.g., silicon) is generally non-yielding, these layers tend to store energy when in a curved or bent state that causes the layers to creep back toward their initial flat state. However, in the curved semiconductor device 200 according to embodiments of the present disclosure, the semiconductor material (e.g., the semiconductor substrate 215) is substantially removed and a metal layer 220 having a low yield strength (that is, it is malleable and amenable to plastic deformation) is added to the device layer 205 to act as a mechanical support, in lieu of the original substrate. By substantially removing the non-yielding semiconductor material and adding the low-yield-strength metal layer 220, the metal layer 220 yields (e.g., the metal layer 220 undergoes plastic deformation) during the curving process and the yielded metal layer 220 provides a stable mechanical support for the semiconductor device layer 205. Because the semiconductor substrate 215 has been substantially or completely removed, the strain energy that would have been stored in the semiconductor substrate 215 has been completely or substantially eliminated. The only strain energy stored in the resulting structure is the strain energy stored in the semiconductor device layer 205. The relatively smaller strain energy stored in the relatively thin device layer 205 allows for the semiconductor device 200 to be maintained in its curved shape. The curved semiconductor device 200 may maintain its curved state without any or with very little creep over extended periods of time, ensuring accurate and reliable device performance even over extended lifespans.

Figure 6:
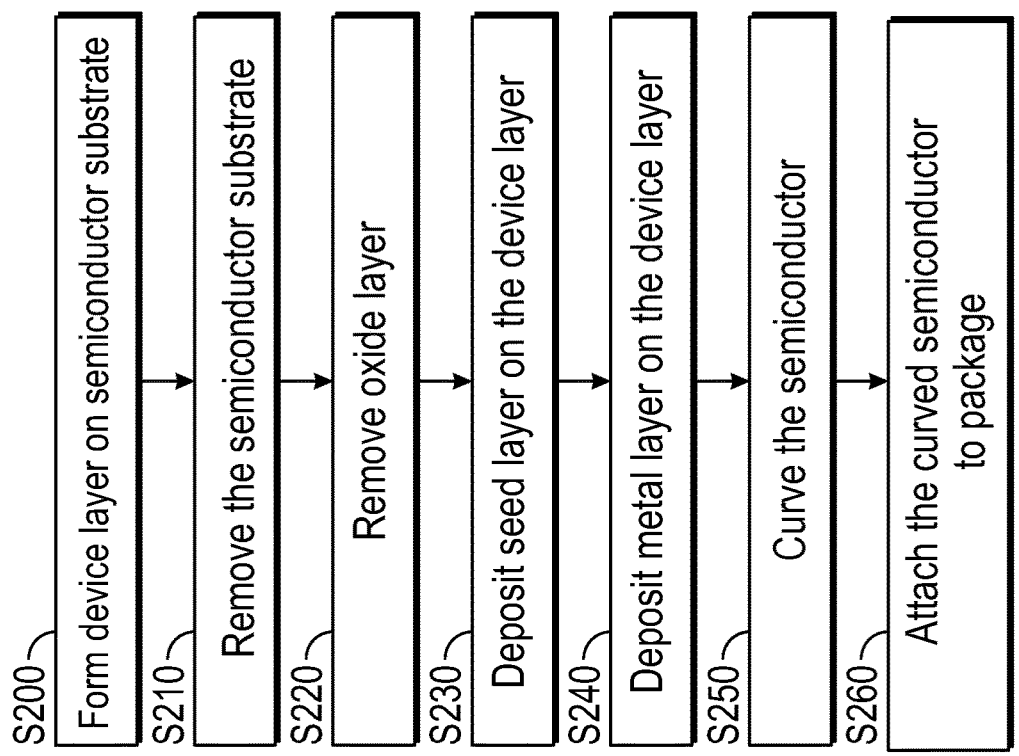
FIG. 6 is a flowchart illustrating the method of forming the curved semiconductor shown in FIG. 5.
Figure 5:
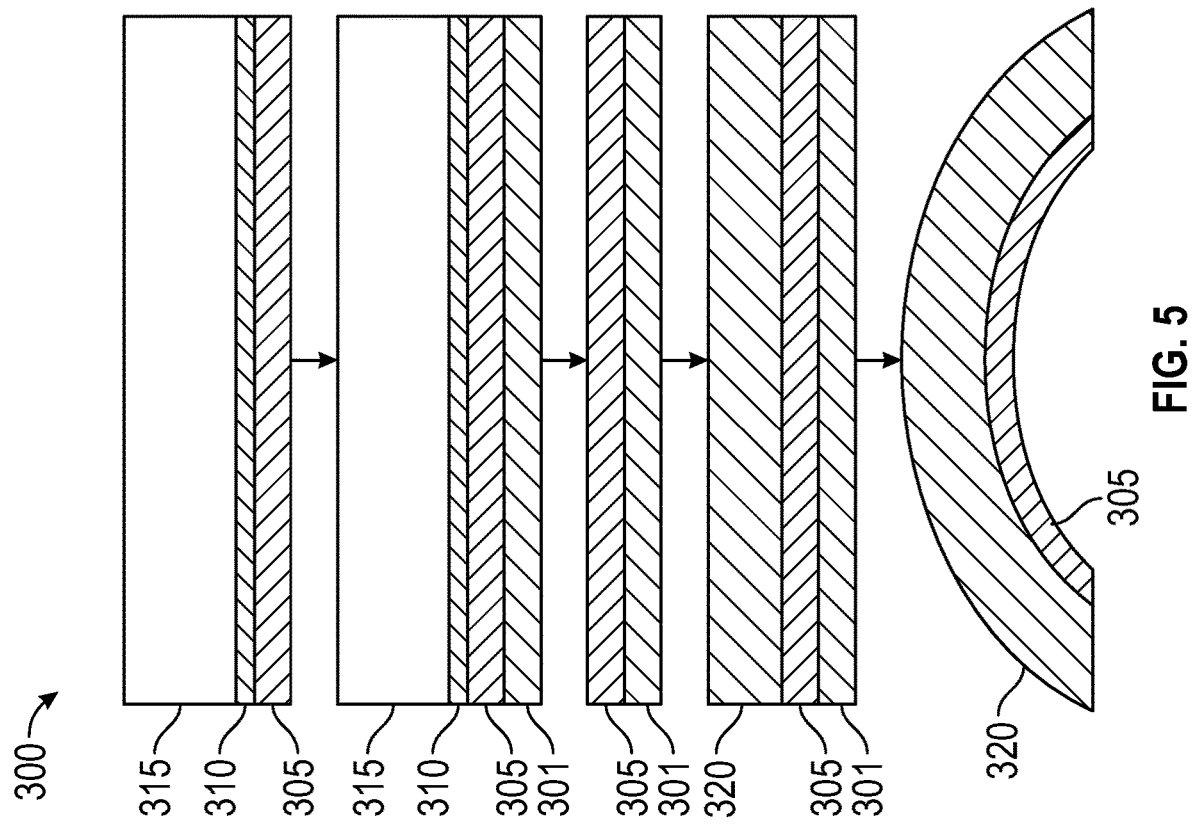
FIG. 5 is a schematic diagram of a method of forming a curved semiconductor according to another embodiment of the present disclosure.

FIG. 5 is a schematic diagram of a method of curving a semiconductor according to another embodiment of the present disclosure, and FIG. 6 is a flowchart illustrating the method of curving the semiconductor shown in FIG. 5. For ease of description, differences between the method of curving a semiconductor shown in FIGS. 3 and 4 and the method of curving a semiconductor shown in FIGS. 5 and 6 will primarily be described. Elements with a similar reference numeral (e.g., device layers 205 and 305, semiconductor substrates 215 and 315, etc.) should generally be considered to have similar characteristics unless explicitly described otherwise.

Referring to FIGS. 5 and 6, a device layer 305 is formed on a semiconductor substrate (e.g., a semiconductor carrier) 315 and/or on an oxide layer 310 (S200). The device layer 305 may be similar to the device layer 205 described above, the semiconductor substrate 315 may be similar to the semiconductor substrate 215 described above, and the oxide layer 310 may be similar to the oxide layer 210 described above. Accordingly, repeated descriptions of the device layer 305, the oxide layer 310, and the semiconductor substrate 315 may be omitted.

Next, the device layer 305 is mounted onto a handle 301. The handle 301 supports the device layer 305 during the subsequent acts and prevents or substantially reduces the chances of the relatively fragile device layer 305 from cracking or breaking. The handle 301 may be temporarily bonded to the device layer 305 by, for example, a wax-based adhesive that can be applied and released by using heat and washed off using chemical rinses.

Then, the semiconductor substrate 315 is removed (S210). The semiconductor substrate 315 may be removed by using methods similar to or the same as those described above for removing the semiconductor substrate 215 in act S140, such as lapping and/or dry or wet etching. Because the device layer 305 may be relatively very thin and fragile after the semiconductor substrate 315 is removed, the semiconductor device 300 (e.g., the device layer 305) may be placed into a fixture prior to the semiconductor substrate 315 being removed (e.g., being lapped and/or etched).

In some embodiments, the oxide layer 310 may also be removed (S220). The oxide layer 310 may be removed by using methods similar to or the same as those described above for removing the oxide layer 210 in act S150, such as dry or wet etching. In some embodiments, however, the oxide layer 310 may not be removed to provide additional protection for the device layer 305. However, even in embodiments in which the oxide layer 310 is removed, some of oxide may remain on the device layer 305 to protect the device layer 305 during the formation of subsequent layers. The remaining oxide may be between a few tenths of a nanometer to a few microns in thickness.

Next, a seed layer (not shown) may be formed on (e.g., may be deposited on) the device layer 305 (S230). In some embodiments, however, the seed layer may be omitted. The seed layer may be similar to the seed layer described above with respect to act S110, however, in this embodiment, the seed layer is deposited on the newly-exposed surface of the device layer 305 from which the semiconductor substrate 315 and/or the oxide layer 310 were removed.

A metal layer 320 is formed on (e.g., is deposited on) the device layer 305 and/or the seed layer, when present (S240). The metal layer 320 may be similar to the metal layer 220 described above with reference to act S120. For example, the metal layer 320 may be planarized after it is formed, similar to the metal layer 220 described above. Different from the embodiment described with reference to FIGS. 3 and 4, in the embodiment shown in FIGS. 5 and 6, the seed layer and the metal layer 320 replace the semiconductor substrate 315 (e.g., are formed on the same surface of the device layer 305 from which the semiconductor substrate 315 was removed). Therefore, the device layer 305 may be formed normally (e.g., may not be formed inverted) because the same surface of the device layer 305 remains exposed throughout the manufacturing process. After the metal layer 320 is formed (and planarized), the handle 301 is removed from the device layer 305.

Then, the semiconductor device 300 may be diced from the wafer (e.g., any excess material may be removed by, for example, etching or physical cutting) in preparation for being bent or curved.

Next, the semiconductor device 300 (e.g., the device layer 305 and the metal layer 320) may be curved (S250). The curving of the semiconductor device 300 may be similar to act S160, described above.

Then, the curved semiconductor device 300 may be attached to a package (S260). The attaching to the package may be similar to the similar act described above.

By replacing the non-yielding semiconductor substrate 315 with the low yielding metal layer 320 having a low yield strength, the semiconductor device 300 may be curved into a three-dimensional shape and may more easily maintain its curved shape for a relatively long period of time. For example, because the overall thickness of the semiconductor material is substantially reduced (e.g., is reduced to be in a range of about 2 to about 20 microns) while a relatively thick metal layer 320 (e.g., having a thickness in a range of about 50 to about 140 microns or greater) is disposed on the remaining semiconductor material (e.g., is deposed on the device layer 305), the metal layer 320 may yield during the curving process and may resist any energy stored in the remaining, non-yielding semiconductor material to maintain the curved shape of the semiconductor device 300 for a relatively long period of time.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the terms "exemplary" and "example" are intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although example embodiments of a mid-IR optical waveguide and a method of manufacturing the same have been described and illustrated herein, many modifications and variations within those embodiments will be apparent to those skilled in the art. Accordingly, it is to be understood that a mid-IR optical waveguide and a method of manufacturing the same according to the present disclosure may be embodied in forms other than as described herein without departing from the spirit and scope of the present disclosure. The present disclosure is defined by the following claims and equivalents thereof.

What is claimed is:

1. A curved semiconductor comprising:
   a curved semiconductor device layer;

a curved metal layer on the semiconductor device layer, the combined device layer and metal layer have a length-to-thickness ratio of about 20 to about 50; and a package attached to both the semiconductor device layer and the metal layer, wherein edges of the semiconductor device layer and the metal layer are coplanar, wherein a first surface of the semiconductor device layer contacts a second surface of the metal layer, wherein the second surface of the metal layer and a first surface of the metal layer, opposite to the second surface, are curved, and wherein the first surface of the metal layer is attached to the package such that the metal layer is between the semiconductor device layer and the package.

2. The curved semiconductor of claim 1, wherein the metal layer comprises copper.

3. The curved semiconductor of claim 1, wherein the semiconductor device layer has a side edge length of greater than or equal to about 3 cm.

4. The curved semiconductor of claim 1, wherein an overall thickness of a semiconductor material in the curved semiconductor is in a range of about 2 microns to about 20 microns.

5. The curved semiconductor of claim 1, wherein the metal layer has a thickness of about 50 microns or greater.

6. The curved semiconductor of claim 1, wherein the semiconductor device layer comprises an imaging sensor.

7. The curved semiconductor of claim 1, wherein the metal layer is thicker than the semiconductor device layer.

8. The curved semiconductor of claim 1, wherein a second surface of the semiconductor device layer, opposite to the first surface of the semiconductor device layer opposite, is concavely curved.

9. The curved semiconductor of claim 1, wherein the metal layer is continuous on the semiconductor device layer.

10. The curved semiconductor of claim 1, wherein the package comprises metal, glass, or a semiconductor.

11. The curved semiconductor of claim 10, wherein the metal layer is attached to the package by glue, solder, or a mechanical fastener.

12. The curved semiconductor of claim 1, wherein the metal layer is deposited onto the semiconductor layer.

* * * * *